United States Patent
Horiuchi et al.

(10) Patent No.: US 8,472,188 B2
(45) Date of Patent: Jun. 25, 2013

(54) SEMICONDUCTOR POWER MODULE, INVERTER, AND METHOD OF MANUFACTURING A POWER MODULE

(75) Inventors: Keisuke Horiuchi, Hitachinaka (JP); Atsuo Nishihara, Kashiwa (JP); Hiroshi Hozoji, Hitachiota (JP); Michiaki Hiyoshi, Yokohama (JP); Takehide Yokozuka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 424 days.

(21) Appl. No.: 12/707,207

(22) Filed: Feb. 17, 2010

(65) Prior Publication Data

US 2010/0208427 A1    Aug. 19, 2010

(30) Foreign Application Priority Data

Feb. 18, 2009    (JP) ................................. 2009-035819

(51) Int. Cl.
*H05K 7/20*    (2006.01)
*F28F 7/00*    (2006.01)

(52) U.S. Cl.
USPC ........................... 361/699; 165/80.4; 361/703

(58) Field of Classification Search
None
See application file for complete search history.

(56) References Cited

U.S. PATENT DOCUMENTS

| 5,966,291 | A | * | 10/1999 | Baumel et al. | 361/707 |
| 6,052,284 | A | * | 4/2000 | Suga et al. | 361/699 |
| 6,906,404 | B2 | * | 6/2005 | Maly et al. | 257/678 |
| 7,215,545 | B1 | * | 5/2007 | Moghaddam et al. | 361/699 |
| 2001/0014029 | A1 | * | 8/2001 | Suzuki et al. | 363/141 |
| 2003/0053294 | A1 | * | 3/2003 | Yamada et al. | 361/699 |
| 2007/0089291 | A1 | * | 4/2007 | Osanai | 29/841 |
| 2008/0291628 | A1 | * | 11/2008 | Aoki et al. | 361/699 |

FOREIGN PATENT DOCUMENTS

| JP | 05-013417 | 1/1993 |
| JP | 06-224335 | 8/1994 |
| JP | 09-003510 | 1/1997 |
| JP | 11-121668 | 4/1999 |
| JP | 2002-018538 | 1/2002 |
| JP | 2005-026255 | 1/2005 |
| JP | 2005-191502 | 7/2005 |
| JP | 2007-295765 | 11/2007 |

* cited by examiner

*Primary Examiner* — Gregory Thompson
(74) *Attorney, Agent, or Firm* — Antonelli, Terry, Stout & Kraus, LLP.

(57) ABSTRACT

A semiconductor power module includes an insulated substrate with a plurality of power semiconductor devices mounted thereon and a heat sink for radiating heat generated from the plurality of power semiconductor devices, wherein the heat sink is integrally molded with a plurality of radiation fins on one surface of a planate base by forging work such that a metallic material filled into a female die of a predetermined shape is pressed by a male die of a predetermined shape, and the insulated substrate is bonded by metallic bonding to another surface of the base of the heat sink opposite the one surface of the base of the heat sink on which the radiation fins are formed.

7 Claims, 12 Drawing Sheets

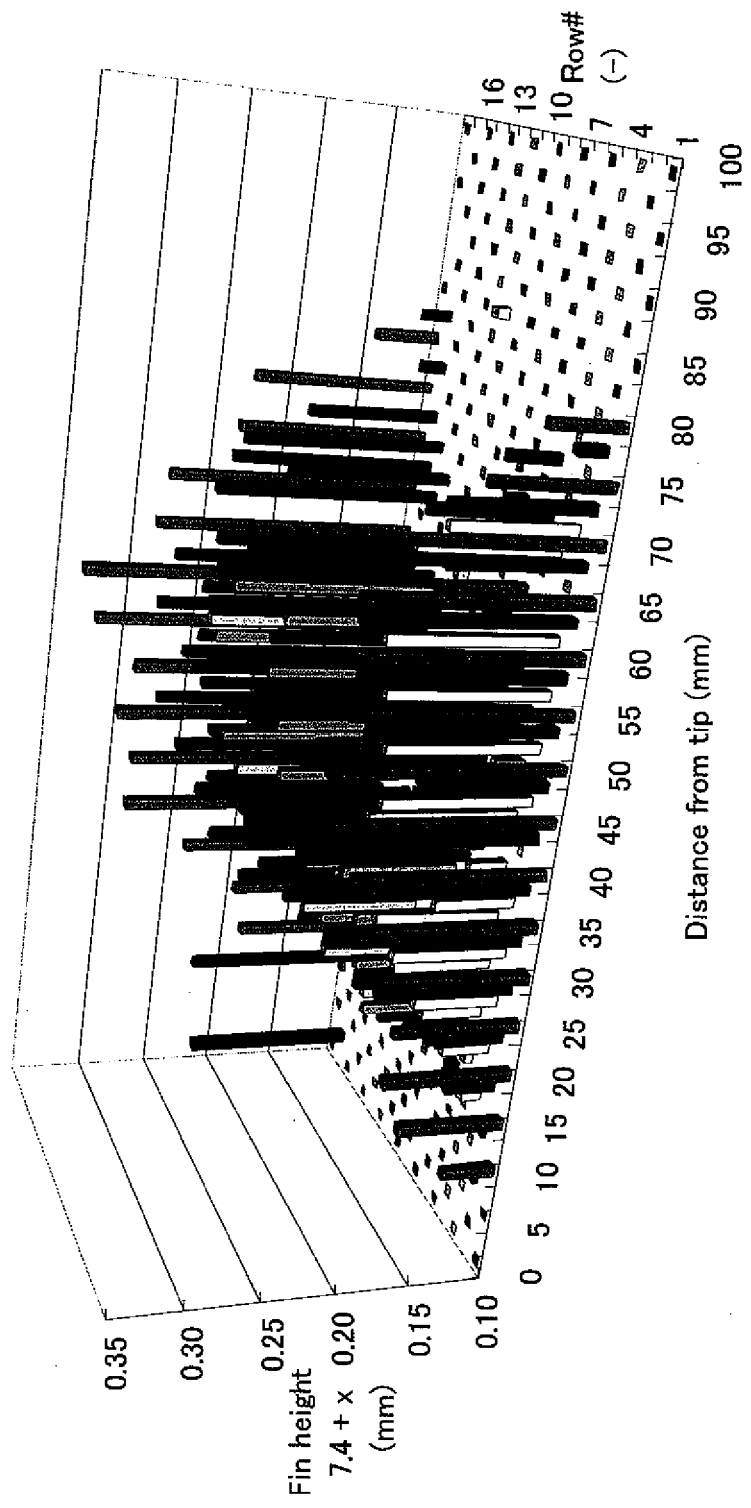

SEMICONDUCTOR POWER MODULE, INVERTER, AND METHOD OF MANUFACTURING A POWER MODULE

BACKGROUND OF THE INVENTION

The present invention relates to a semiconductor power module with a power semiconductor device, such as an insulated gate bipolar transistor (hereinafter, referred to as IGBT), mounted thereon, and to a power inverter with the semiconductor power module, and to a method of manufacturing the semiconductor power module.

In the semiconductor power modules for use in the power inverter mounted on electric vehicles, hybrid vehicles, etc., it is required to cool down the modules effectively since their heat value is large, and a liquid cooling is therefore effective as their cooling means. In the liquid cooling, radiation fins are normally adhered on the semiconductor power module via a thermal conduction grease, for example, and the radiation fins are immersed in a flow path of a coolant water. However, the thermal conduction grease has a drawback of such that its heat transfer resistance is high compared with metals.

In contrast, for a purpose of acquiring a higher cooling capacity, JP-A-2007-295765 and JP-A-2005-191502 have been known as a direct cooling-semiconductor power module in which a heat is transferred to a cooling unit without through the thermal conduction grease.

According to the direct cooling-semiconductor power module, the power semiconductor device is directly mounted on the upper surface of heat sink via an insulated layer, and the radiation fins are formed on the lower surface of the heat sink. In this case, this configuration is that an opening portion of an upper surface of a coolant water flow path is closed by a lower surface of heat sink. Therefore, the lower surface of heat sink is directly contacted to the coolant water to improve a cooling efficiency of the heat sink.

In this case, materials of the heat sink are generally of composite materials (SiC, W, Mo, Si, Ni—Fe, etc.) of a low thermal expansibility typified by Al—SiC, and high thermally-conducting materials (Cu, Al) etc. However, there is a problem that the composite materials have 150 to 300 W/mK in coefficient of thermal conductivity, which is lower than that of pure copper (Cu), and are high cost since the manufacturing process is complicated.

In consequence, the JP-A-2007-295765 has disclosed an example using an alloy for the heat sink, which contains copper (Cu), as a chief component, and other materials having inexpensive and good heat conductivity. However, in the case of JP-A-2007-295765, the configuration is that the radiation fins are brazed to the base of heat sink. Therefore, the cooling capacity of the radiation fins should be descended by causing the heat transfer resistance at the brazed portion, compared with the radiation fins which are integrally molded with the pure copper as a base material, for example.

JP-A-2002-18538 has disclosed a technique in which the fins are pressed into the base of heat sink, as a joining method. However, a clearance gap is easily appeared at the joined portion since the base is not integrally molded with the fins, therefore, there is a problem that the cooling capacity is descended by causing the clearance gap.

As for method of integrally molding the base and fins of the heat sink, JP-A-2005-26255 has disclosed a method for a press molding of a copper powder. JP-A-9-3510 has disclosed a method for an injection molding using a binder for joining the copper powder. However, in the case of those methods, the coefficient of thermal conductivity becomes lower than that of a pure copper plate material since the heat sink is molded from the copper powder. Further, there is a problem to cause a void.

As for the method of integrally molding the base and fins of the heat sink, a cutting work method and a forging work method have also been known as disclosed in JP-A-6-224335. These above-mentioned methods are excellent in the sense that high cooling capacity can be obtained in use as a heat sink. However, the cutting work method is unsuitable for commercial production. In also the case of the forging work method, it is difficult to form pin fins (pin type fin) uniformly on an entire copper plate which is sufficiently large as the base of heat sink to be used for the semiconductor power module. Such above-mentioned technical problems have not been adopted so far, and a solution has not been proposed at present.

SUMMARY OF THE INVENTION

For example, in the case of a fin-attached heat sink for use in a 6in1 (six-in-one) power module of the power inverter, the base size becomes large over 10 cm×10 cm. When the fin-attached heat sink of such above-mentioned size is actually manufactured by forging the copper, it is appreciated that the fins (hereinafter, fin is a pin fin in the description unless otherwise noted) formed on the central portion of base often result in a longer length and the fins formed on a peripheral portion thereof result in a shorter length. Therefore, it is difficult to make the all fins the same length on the base.

Further, an insulated substrate with the power semiconductor devices mounted thereon is bonded on such large sized base of heat sink by a metallic bonding such as a soldering. In this case, a phenomenon appears such that the base is bent convexly to the substrate side after the metallic bonding, by causing a linear expansion coefficient difference between the base of the copper heat sink and the insulated substrate made of a ceramics etc.

In light of the above-mentioned technical problems, an object of the invention is to provide a semiconductor power module providing a fin-attached heat sink capable of making the length of pin fins even and preventing the bending of base, even though a forged fin-attached heat sink has a large sized base as large as 10 cm×10 cm or over, and a manufacturing method of the semiconductor power module, and also provide a power inverter using the semiconductor power module.

According to an aspect of the invention, a semiconductor power module comprises: an insulated substrate with a plurality of power semiconductor devices mounted thereon; and a heat sink integrally molded with a plurality of radiation fins on one surface of a planate base by a forging work such that a metallic material filled into a female die of a predetermined shape is pressed by a male die of a predetermined shape, for radiating a heat generated from the plurality of power semiconductor devices, wherein the heat sink and the insulated substrate are bonded metallically with another surface of the heat sink opposite the one surface on which the radiation fins are molded with the base of the heat sink.

According to another aspect of the invention, a shot blasting work that blasts small balls harder than the metallic material is applied to the one surface of the base on which the radiation fins are formed, prior to metallically bonding the insulated substrate on which the plurality of power semiconductor devices are mounted to the base of the heat sink.

The radiation fins formed on the base of heat sink include substantially circular pin fins in a shape of cross section, pin fins having a diameter at an end portion substantially equal to that at a base portion being molded on a peripheral portion of the base, and pin fins having a diameter at the end portion gradually made smaller than that at the base portion being molded on a central portion of the base.

According to the invention, the length of pin fins can be made even on the forged heat sink used for the semiconductor power module in the power inverter, and the bending of the base on the heat sink can be prevented.

The other objects, features and advantages of the invention will become apparent from the following description of the embodiments of the invention taken in conjunction with the accompanying drawings.

BRIEF DESCRIPTION OF THE DRAWINGS

FIG. 7 is a diagram showing a fin length distribution of an A-portion fin group to be formed by manufacturing the heat sink forged with copper;

DESCRIPTION OF THE EMBODIMENTS

Hereinafter, an embodiment of the invention will be described with reference to the drawings.

Figure 1:
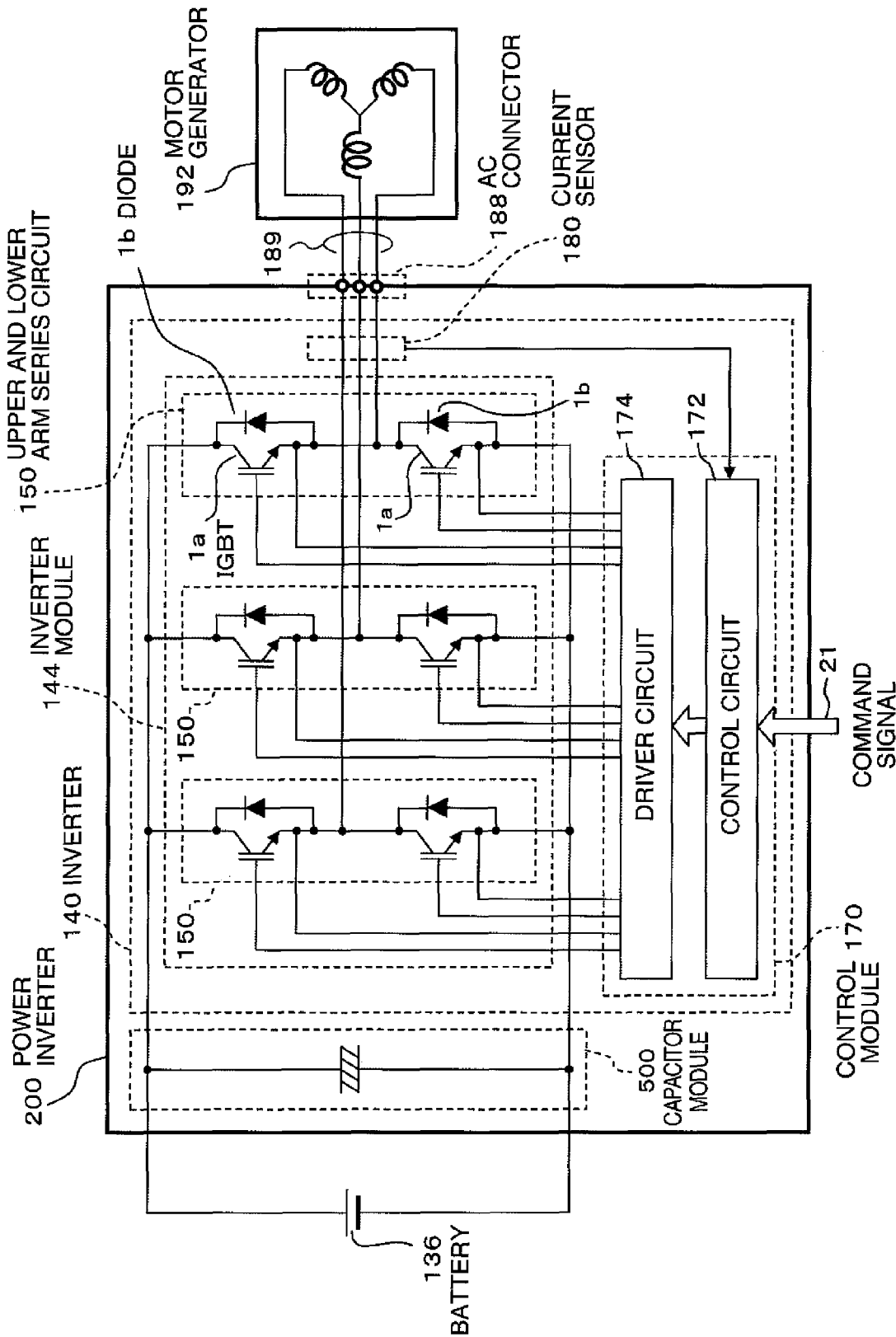
FIG. 1 is a diagram showing a circuit block configuration of a power inverter in an embodiment of the invention.

FIG. 1 is a diagram showing a circuit block configuration, as an example, of a power inverter in the embodiment of the invention. As shown in FIG. 1, a power inverter 200 is connected with a battery 136 and a motor generator 192 to convert a DC current supplied from the battery 136 into a three-phase AC current, and the three-phase AC current is supplied to the motor generator 192 through AC terminals 189 connected to an AC connector 188.

The power inverter 200 in the embodiment is configured by including a capacitor module 500 to be used for making the DC current supplied from the battery 136 stable and smoothed, and an inverter device 140 for generating a three-phase AC current from the DC current. The inverter device 140 is configured by including an inverter module 144 containing three upper and lower arm DC circuits 150 and a control module 170 for controlling the inverter module 144.

In the inverter module 144, each of the upper and lower arm series circuits 150 is configured that two current switching circuits each containing a parallel connected circuit of an IGBT 1a and a diode 1b are arranged in series. The upper and lower ends of the upper and lower arm series circuit 150 are connected respectively to a positive pole and a negative pole of the battery 136. The current switching circuit configured by the IGBT 1a and diode 1b arranged on the upper side (positive pole side) operates as the so-called upper arm, and the current switching circuit configured by the IGBT 1a and diode 1b arranged on the lower side (negative pole side) operates as the so-called lower arm.

The inverter module 144 is configured by a so-called three-phase bridge circuit in which there are provided with three units of the above-mentioned upper and lower arm series circuit 150. The three-phase AC currents u, v and w are output from the middle point positions at the respective upper and lower arm series circuits 150 or from respective connected portions at the upper and lower current switching circuits. The three-phase AC currents u, v and w as outputs are supplied to the motor generator 192.

The control module 170 is configured by including a driver circuit 174 for driving and controlling the inverter module 144 and a control circuit 172 for supplying a control signal to the driver circuit 174. Here, a signal output from the driver circuit 174 is supplied to the respective IGBT 1a(s) resided on the upper and lower arm in the inverter module 144 to control their switching operation and control amplitudes, phases, etc. of the AC current u, v and w output from the respective upper and lower arm series circuits 150.

The control circuit 172 provides a microcomputer for computing and processing switching timings for the respective IGBTs 1a in the inverter module 144. The microcomputer receives, as input information, a target torque value to be requested for the motor generator 192, a current value to be supplied from the upper and lower arm series circuit 150 to the motor generator 192, and a magnetic pole position of a rotor on the motor generator 192.

Of pieces of the input information, the target torque value is based on a command signal output from a high-ordered controller (not shown). The command signal is supplied to the control circuit 172 via a connector 21. The current value is based on a detected signal from a current sensor 180 which detects a current value of the AC current output from the respective upper and lower arm series circuits 150. The magnetic pole position is based on a detected signal from a rotating magnetic pole sensor (not shown) mounted on the motor generator 192.

The control module 170 has a function for detecting an abnormality such as an excessive current, an excessive voltage, an excessive temperature, etc. to protect the upper and lower arm series circuits 150. In fact, an emitter electrode of the IGBT 1a in the respective arms is connected with the driver circuit 174 which detects the excessive current at the emitter electrode for every IGBT 1a. The IGBT 1a at which the excessive current is detected is stopped for its switching operation to protect it from the excessive current.

The control circuit 172 receives signals from a temperature sensor (not shown) mounted on the upper and lower arm series circuit 150 and from a detection circuit for detecting a DC voltage to be applied to the both ends of upper and lower arm series circuit 150 to detect the abnormality such as excessive temperature, excessive voltage, etc. on the basis of these signals. When detecting the abnormality of the excessive temperature, excessive voltage, etc., all of the IGBTs 1a are stopped for their switching operation to protect the entire inverter module 144 from the abnormality of the excessive temperature, excessive voltage, etc.

In addition, in the above-mentioned power inverter 200, the current switching circuit of the IGBT 1a and diode 1b may be configured by using MOSFET (Metal-Oxide-Semiconductor Field-Effect Transistor). The inverter module 144 may be configured by two upper and lower arm series circuits 150 to output a two-phase AC current. Further, the power inverter 200 may be an inverter which converts the three-phase (two-phase) AC current, into the DC current, output from a mostly similar configuration to the circuit shown in FIG. 1.

Figure 2:
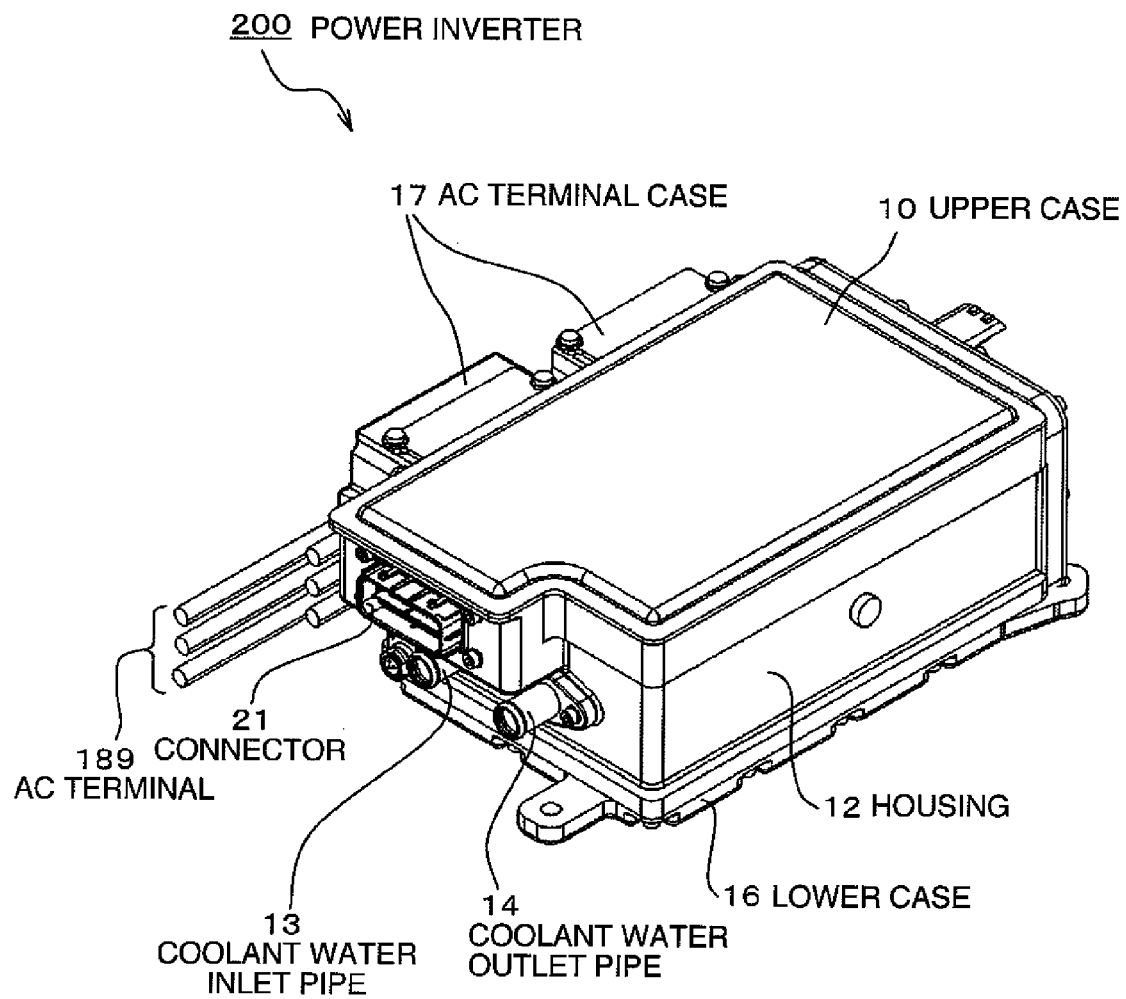
FIG. 2 is an exterior perspective view showing the power inverter.

FIG. 2 is an exterior perspective view showing the power inverter in the embodiment of the invention. As shown in FIG. 2, the power inverter 200 is configured in mechanical structure by an upper case 10, a housing 12 and a lower case 16.

In this embodiment, two inverter modules 144 are placed in the housing 12. The upper case 10 in which the control module 170 etc. is placed is mounted on the upper portion of housing 12, and the lower case 16 in which the capacitor module 500 is placed is mounted on the lower portion of housing 12.

A coolant water flow path (not shown) is formed in the housing 12 to cool down the inverter module 144. A coolant water inlet pipe 13 is provided on one sided wall of the housing 12 to supply the coolant water to the coolant water flow path, and a coolant water outlet pipe 14 is also provided thereon to run out the coolant water warmed up by the inverter module 144 from the coolant water flow path.

Two AC terminal cases 17 are provided in correspondence with the two inverter modules 144 on the other sided wall of the housing 12. Three AC terminals 189 corresponding to the three-phase AC currents u, v and w are held in the respective AC terminal cases 17. A connector 21 is provided on one sided wall of the upper case 10 to hold a signal line so that the control module 170 receives and transmits a signal from and to an external device such as a high-ordered system.

Figure 3:
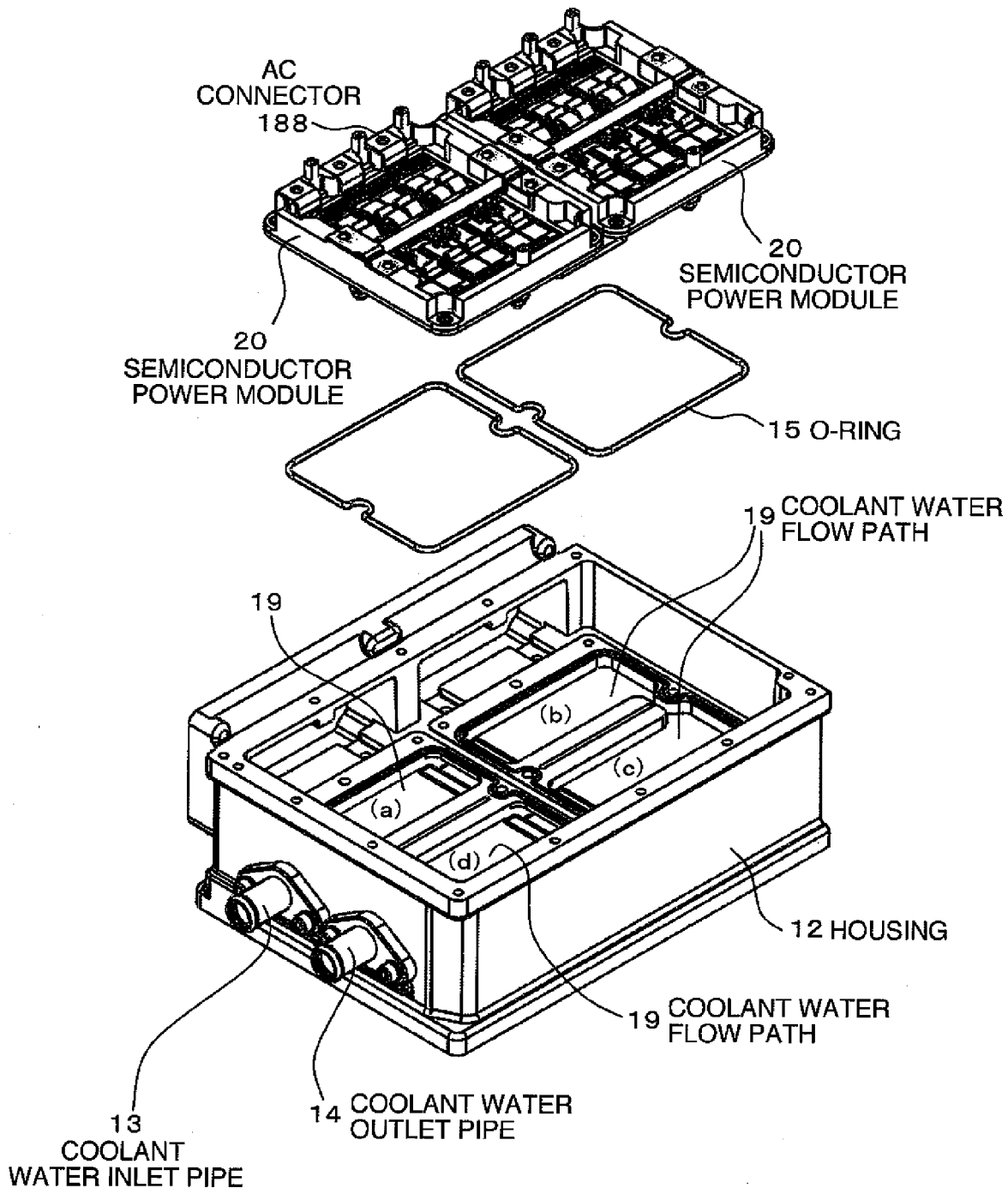
FIG. 3 is a perspective view showing an example of an inner structure of the power inverter.

FIG. 3 is a perspective view showing an internal structure of the housing 12 on the power inverter 200 in this embodiment of the invention. As shown in FIG. 3, a coolant water flow path 19 formed by a pressure die casting etc. is provided in the inner portion of housing 12. The upper portion of coolant water flow path 19 is an opening portion on which two semiconductor power modules 20 are arranged to close the opening portion. In this case, an o-ring 15 is placed between the structure of housing 12 and the semiconductor power module 20, and the o-ring 15 prevents the coolant water flow path 19 from leaking the coolant water.

Here, the semiconductor power module 20 means the inverter module 144 added with the heat sink, but practically, it has a structure in such that the inverter module 144 is supported on the base of heat sink. Therefore, in the case of this embodiment, the heat sink itself assumes a role of closing the opening portion to the upper portion of the coolant water flow path 19. In addition, a physical structure of the semiconductor power module 20 will be described in detail later with reference to the drawings.

Further as shown in FIG. 3, the coolant water supplied from the coolant water inlet pipe 13 passes from a portion (a) of the coolant water flow path 19 to a portion (b) to then flow into a portion (c), and passes to a portion (d) to then run out from the coolant water outlet pipe 14. Here, an interval between the portions (a) and (b) of the coolant water flow path 19 is connected through a tunnel formed on the structure of housing 12, and an interval between the portions (c) and (d) of the coolant water flow path 19 is also connected through a tunnel formed on the structure of housing 12.

Electrodes for current lines and signal lines are attached on a rim portion of the semiconductor power module 20 to connect between the control module 170 arranged on the upper portion of the rim portion and the AC terminal case 17 fixed on the sided wall of housing 12.

Figure 4:
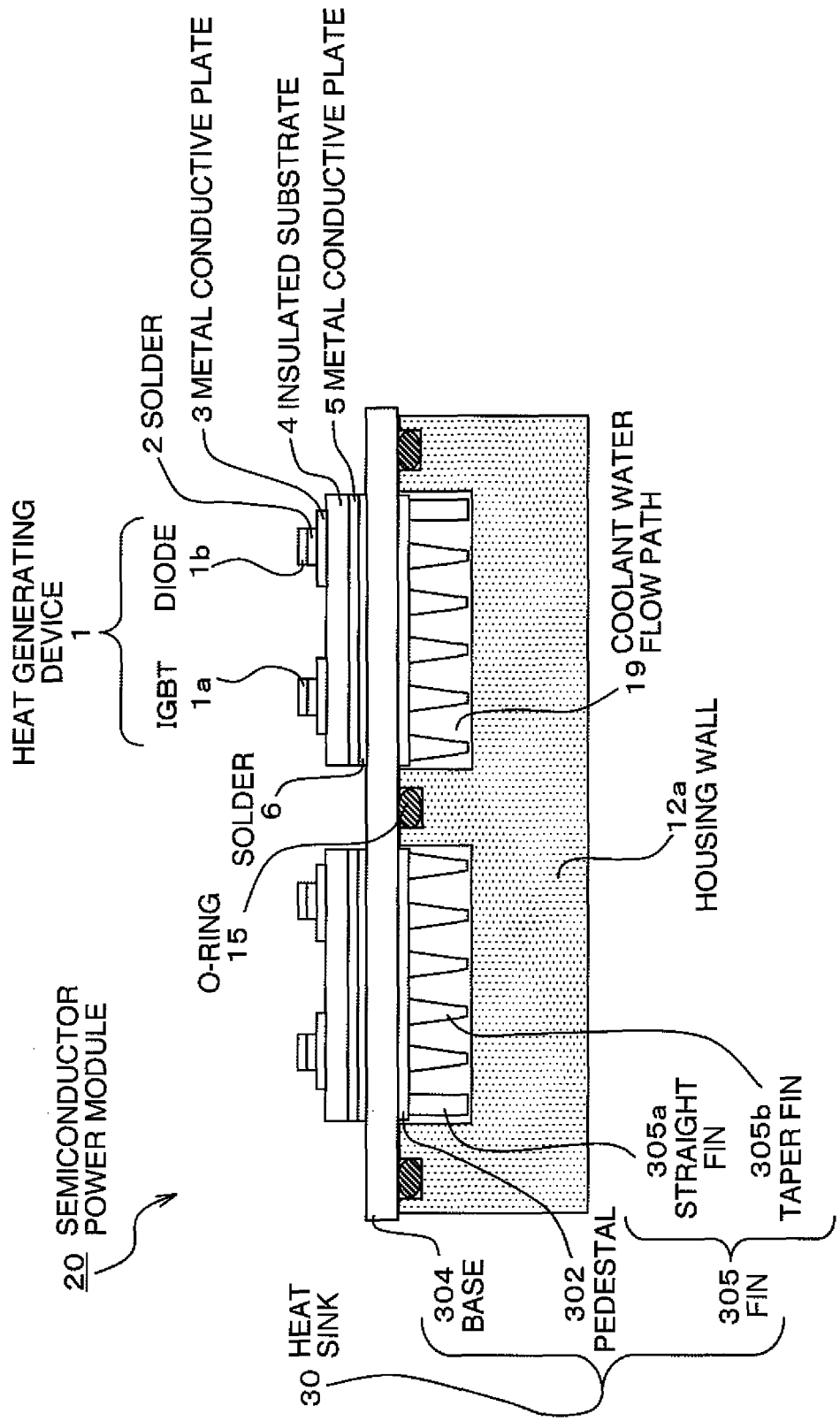
FIG. 4 is a schematic diagram showing an aspect that a semiconductor module is mounted on a housing in the power inverter.

FIG. 4 is a schematic diagram showing an example of mounting the semiconductor power module 20 in this embodiment of the invention on the housing 12 in power inverter 200. As shown in FIG. 4, the semiconductor power module 20 is configured by a metallic bonding of an insulated substrate 4 mounting with heat generating devices 1 including the diode 1b, IGBT 1a, etc., as a power semiconductor device, on a base 304 of a heat sink 30 (made by a metal having high coefficient of thermal conductivity such as copper) having a fin 305.

Here, the insulated substrate 4 may be of a ceramic substrate or a thin insulated sheet. A metal conductive plate 3 is formed as a wiring layer on the upper surface of insulated substrate 4, and the heat generating devices 1 such as the diode 1b, IGBT 1a, etc. are bonded on the upper portion of metal conductive plate 3 via a solder 2. Further, a metal conductive plate 5 is formed on the lower surface of insulated substrate 4, and the insulated substrate 4 is formed by the metallic bonding on the base 304 of heat sink 30 via the metal conductive plate 5 and a solder 6.

The heat sink 30 is configured by the base 304, a pedestal 302 and the fin 305. In this embodiment, the heat sink 30 including elements 304, 302 and 305 is integrally molded by forging the copper. By integrally molding, it is not required to braze the fin 305 to the base 304, so that a radiation performance of the heat sink 30 including the fin 305 can be improved, and its productivity can also be improved.

Further, the heat sink 30 is molded by a forging work, therefore, it is possible that Vickers hardness for the base 304 is made to more than Hv50 even though the material to be forged is copper which is relatively soft. In consequence, a ratcheting deformation of the base 304 caused by a temperature cycle is restrained, so that a sealing performance between the base 304 and a housing wall 12a of the power inverter 200 can be improved.

The insulated substrate 4 is bonded on the base 304 by the solder 6 which is a metal, but not a thermal conduction grease. Therefore, a heat generated from the heat generating devices 1 can be transferred effectively to the base 304. Besides, the base 304, pedestal 302 and fin 305 are integrally molded, so that the heat conductivity up to the fin 305 can be improved.

Further, as shown in FIG. 4, the coolant water flow path 19, the upper surface of which is open, is formed on the housing wall 12a of housing 12 in the power inverter 200. The semiconductor power module 20 is mounted on the housing wall 12a to thereby close the opening portion of the upper surface of the coolant water flow path 19 by the base 304, and the fin 305 are protruded to the coolant water flow path 19. In this case, the fin 305 and pedestal 302 are contacted directly to the coolant water being flown into the coolant water flow path 19, so that the fin 305 and pedestal 302 can be cooled down effectively.

The semiconductor power module 20 is fixed by bolts on the housing wall 12a via bolt holes (not shown) formed on the rim portion of the base 304. In this case, the o-ring 15 is placed onto the circumference of coolant water flow path 19 to seal the coolant water flow path 19 by the o-ring 15.

In this embodiment, the o-ring 15 is used of a sealing material, but may be used of a resin material, a liquid sealant, a packing, etc. in place of the material of o-ring 15.

In also this embodiment, the fin 305 is set to use of a round or circular shape pin typed fin (hereinafter, referred to as pin fin) having good radiation efficiency. FIG. 4 shows that the fin 305 includes discriminately a straight fin 305a and a taper fin 305b, but its details will be described later.

In addition, the fin 305 is not limited to the round shape pin typed fin, but may be of an ellipsoidal shape, a flat plate shape and a corrugated type. The cooling efficiency can be improved when using the fin 305 of the round shape type and the ellipsoidal shape type. In contrast, a pressure loss of flowing the coolant water can be reduced when using the fin 305 of the flat plate shape and corrugated type.

Figure 5:
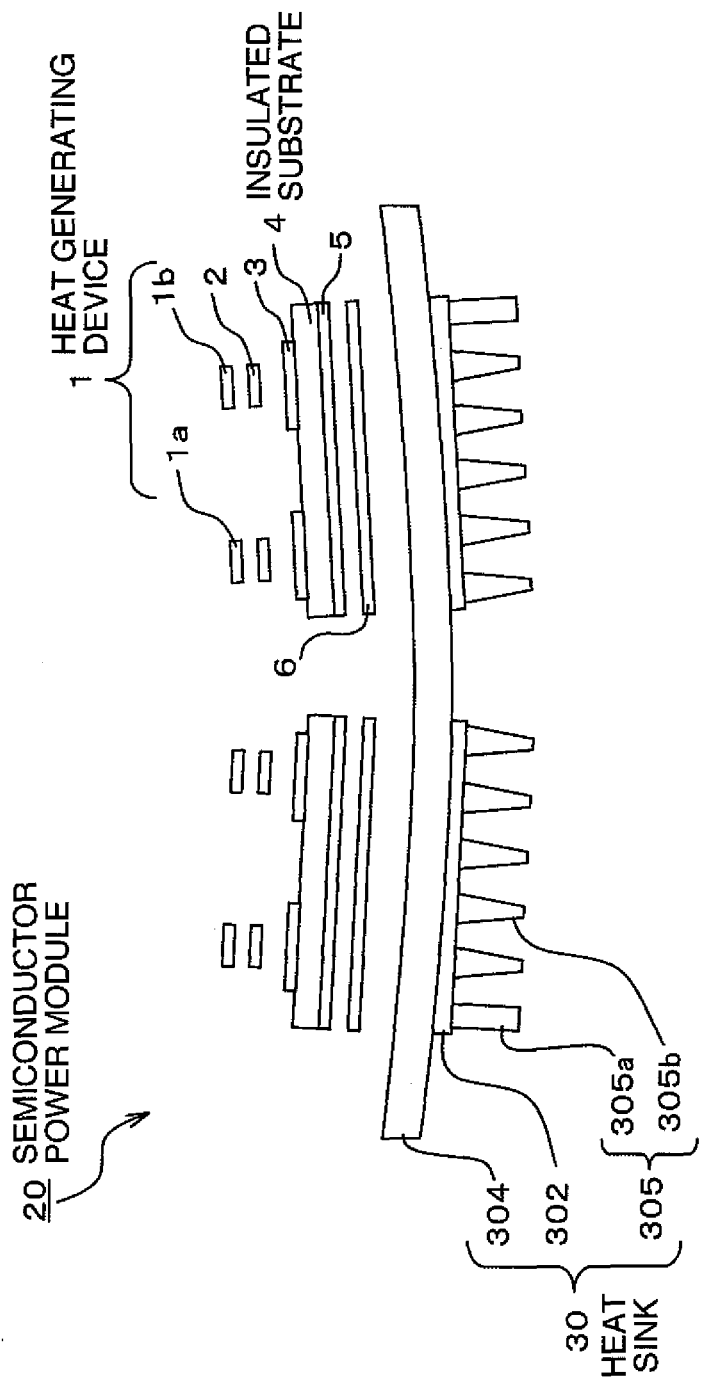
FIG. 5 is an exploded view showing the semiconductor power module.

FIG. 5 is an exploded diagram showing the semiconductor power module 20 in the embodiment of the invention. A manufacturing method of the semiconductor power module 20 will be described for an outline thereof with reference to FIG. 5.

First, the insulated substrate 4, the upper surface of which is formed of the metal conductive plate 3 and the lower surface of which is formed of the metal conductive plate 5, is prepared when manufacturing the semiconductor power module 20. The diode 1b, IGBT 1a, etc. are then bonded on the insulated substrate 4 by using the solder 2. Its bonding steps are a well-known technique, therefore, its description will be omitted here.

Next, the heat sink 30 manufactured by forging the copper is prepared separately. The heat sink 30 including the base 304, pedestal 302 and fin 305 is integrally molded, as described above. In the case of this embodiment, an initial bending as shown in FIG. 5 is added to the base 304 of heat sink 30 after the forging work. That is, the surface of the base 304, on which the insulated substrate 4 is bonded, is bent to a concave shape.

Next, the insulated substrate 4, on which the diode 1b, IGBT 1a, etc. are mounted, is bonded metallically with use of the solder 6 on the base 304, which is added with the initial bending, of the heat sink 30. At the time of applying the metallic bonding, both the insulated substrate 4 and base 304 are heated up to as close as a dissolution temperature of the solder. When the temperature returns at a normal temperature, the base 304 is largely contracted since the linear expansion coefficient of the base 304 is larger than that of the insulated substrate 4. Therefore, the bonded insulated substrate 4 and base 304 generate a stress so as to be bent to a convex shape toward the insulated substrate 4 by the principle similar to the so-called "bimetal" when the temperature returns at the normal temperature. In consequence, the bending disappears at the normal temperature to make the upper surface of base 304 flat.

In addition, an initial bending amount to be added to the base 304 in advance is set appropriately by an experiment, an experiment manufacture, etc. in such that the initial bending amount disappears when returning at the normal temperature.

Further, prior to adding the initial bending to the base 304 after the forging work, a cutting work is applied to the heat sink 30 to make holes etc. for such bolt holes on the rim portion of base 304, with the upper surface of base 304 flattened. A step for removing oxidative products etc. formed on the upper surface of base 304 is performed for improving a wettability of the solder 6. Thereafter, the step proceeds to a step for adding the initial bending to the base 304.

As a method of adding the initial bending to the base 304, there are methods such that the base 304 is corrected by a press work with use of a die having a desirable curvature and that small balls having as large as 40 μm to 1.3 mm in grain diameter and Vickers hardness Hv300 or more are blasted to the lower surface (surface of fin 305 side) of base 304 to thereby add the initial bending by a shot blasting effect (hereinafter, referred to as a shot blasting work or sand blasting work).

In the case of the method of giving the initial bending by the press work, there arises a problem for management such that the life of die must be considered and it is difficult to apply a fine adjustment to the bending amount. In contrast, in the case of the shot blasting work, the small balls having as large as 40 μm to 1.3 mm in grain diameter and Vickers hardness Hv300 or more are blasted to the lower surface of base 304, so that the initial bending can be added to the base 304 and the initial bending can also be adjusted finely without giving damage to the upper surface of base 304 on which the insulated substrate 4 is bonded. Consequently, in this embodiment, the shot blasting work has been employed as the method of adding the initial bending to the base 304. However, the method of correcting by the press work may also be used.

As described above, if the initial bending is added to the base 304 of the heat sink 30 in advance, the semiconductor power module 20 having no bending can be obtained by the above-mentioned principle, after the insulated substrate 4 mounting with the diode 1b, IGBT 1a, etc. is bonded metallically on the upper surface of base 304 to thereby manufacture the semiconductor power module 20.

Figure 6:
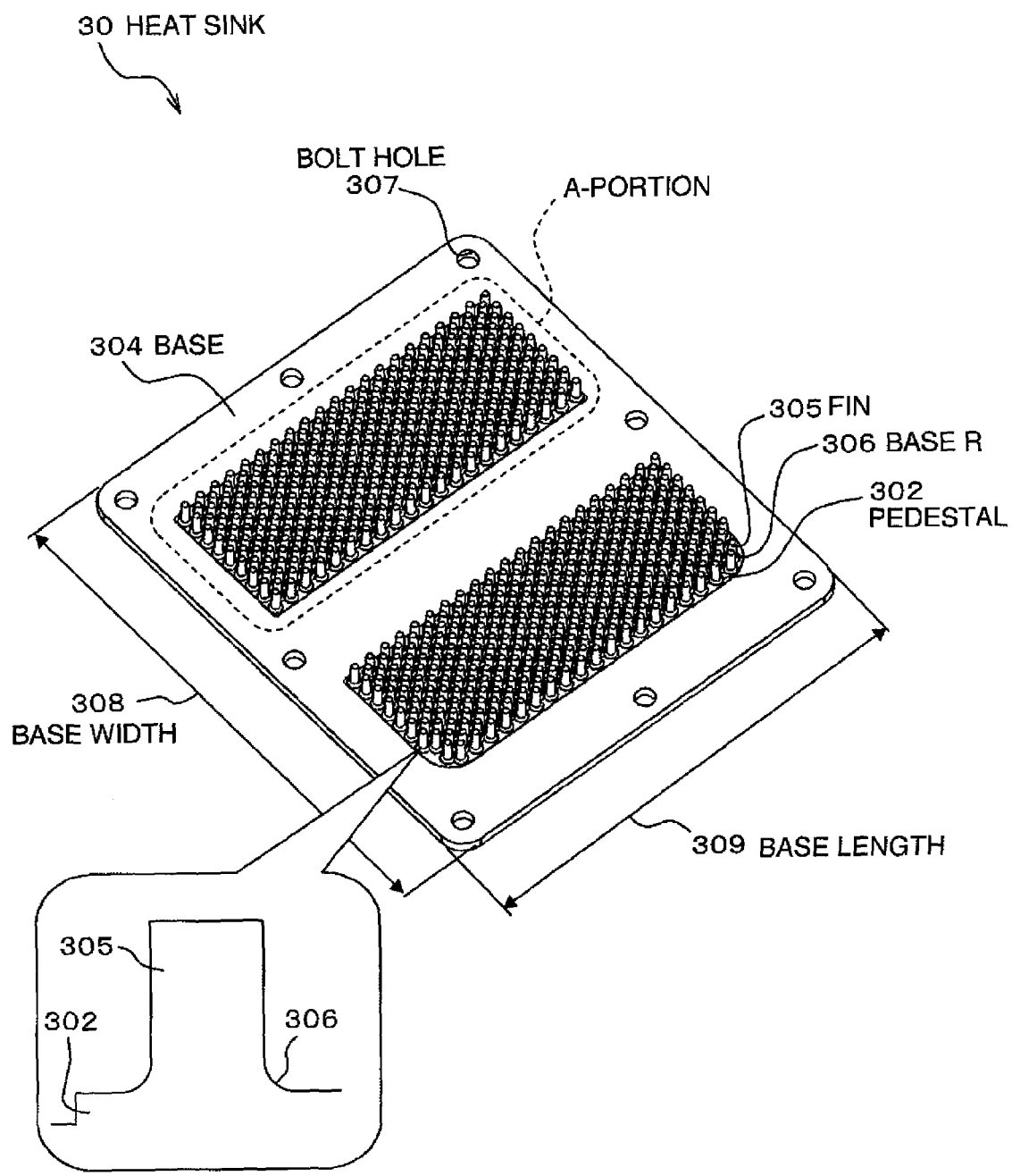
FIG. 6 is a perspective view showing that the lower surface of a heat sink for use in the semiconductor power module is seen from the top.

FIG. 6 is a perspective view showing an example of seeing the lower or bottom surface of the heat sink 30 to be used for the semiconductor power module 20 in the embodiment of the invention. In addition, this heat sink 30 is assumed to one before adding the initial bending to the base 304.

As shown in FIG. 6, in this embodiment, a circularly round portion (hereinafter, the circularly round portion is referred to as a base R 306) is formed at the base portion of the fin 305, or at the base portion formed between the fin 305 and pedestal 302 so that the forging work for the heat sink 30 is made easily.

Further, a milling work is applied to the portion of base 304, except for an area on which the fin 305 is formed, for improving the sealing performance of coolant water flow path 19, that is, an adhesion between the base 304 and the o-ring 15. For this reason, the pedestal 302 remains or forms on the area on which the fin 305 was formed. At the same time of applying the milling work, bolt holes 307 are also formed for fixing the semiconductor power module 20 to the housing wall 12a.

Actually, a base width 308 and a base length 309 of the heat sink 30 are determined by matching the size of heat generation device 1 (diode 1b and IGBT 1a) to be mounted on the insulated substrate 4 with the size of electrode terminals for DC and AC currents, etc. In fact, in the case of the inverter module 144 with a three-phase bridge circuit, 12 devices (two devices×three-phase×two arms) are mounted on one semiconductor power module 20.

When the size of diode 1b to be mounted is 12.5 mm×7.3 mm and the size of IGBT 1a is 14 mm×12.5 mm, the base width 308 becomes as large as 145 mm and the base length 309 becomes as large as 130 mm. Further, when the size of diode 1b to be mounted is 10 mm×7.0 mm and the size of IGBT 1a is 10 mm×10 mm, the base width 308 becomes as large as 100 mm and the base length 309 becomes as large as 100 mm.

As described above, a semiconductor power module, in which the inverter module 144 of the three-phase bridge consisting of 12 devices (two devices (IGBT 1a and diode 1b)×three of phases×two arms) is physically and integrally configured, is often referred to as a 6in1 (six-in-one) power module.

FIG. 7 is a diagram showing a fin length distribution example of the fin 305 in an A-portion fin group when the heat sink 30 is manufactured by forging the copper. Here, the A-portion fin group means the fins included in an area (A-portion) enclosed by a dotted line in FIG. 6. The fins 305 included in the area (A-portion) are assumed to the straight fin 305a all. The straight fin 305a is a round pin fin of which a diameter of the base portion (except for the portion of base R 306) is substantially equal to that of the end portion.

The forging work of the heat sink 30 will be described with reference to FIGS. 8A to 8D in details later. However, generally, a force pressing from the top is often resulted in converging on the central portion of base 304 and in weakening on a peripheral portion thereof in the forging work. For this reason, as shown in FIG. 7, it is appreciated that the length of fins 305 formed on the central portion of base 304 becomes long and that of the fins 305 formed on the peripheral portion thereof becomes short. Particularly, a length variation of the fin 305 arises easily in the case of the 6in1 (six-in-one) power module of the three-phase bridge configuration having a large base area.

When the fins 305 varying in length are protruded into the coolant water flow path 19, a flow velocity distribution also varies for the coolant water being flown between the fins 305, and a surface area of the fins 305 being contacted to the coolant water becomes uneven. In consequence, the cooling capability for each of the fins 305 becomes uneven. The total cooling capability also descends when the cooling capability for each of the fins 305 becomes uneven.

As for a method of making the fins 305 the same length, there are machine works such as a milling work, an end milling work, etc. for applying to the uneven length fins 305 after the forging work. However, the fin 305 is frequently fallen or broken by the machine work when the fin 305 is a thin typed pin fin, as described in this embodiment. Further, the machining time of machine work requires generally a long time, therefore, the machining cost also increases.

Consequently, in this embodiment, the fins 305, the length of which often results in long, of the central portion on the base 304 are formed of the taper fins 305b, and the fins, the length of which often results in short, of the peripheral portion on base 304 are formed of the straight fins 305a, so that the length of the forged fins 305 becomes even. Here, the taper fin 305b is a round pin fin of which a diameter of the end portion of the pin fin is made smaller than that of the base portion (except for the portion of base R 306) thereof.

Generally, at the time of forming the pin fins by the forging work, the straight fin 305a is formed longer than the taper fin 305b when pressing from the top by a certain force. A reason of the above phenomenon will be described later. However, if using this phenomenon, the fins 305 of the central portion, on which the pressing force is converged from the top, of the base 304 are formed of the taper fin 305b, and the fins 305 of the peripheral portion, on which the pressing force is weakened, of the base 304 are formed of the straight fin 305a. In this way, the length of the taper fins 305b formed on the central portion can be made substantially even with the length of the straight fins 305a formed on the peripheral portion.

As described above in this embodiment, as a result of the forging work, the length of the fins 305 formed on the base 304 can be made even, therefore, it is not required to apply the machine work to the fin 305 after the forging work. In consequence, a manufacturing efficiency of the heat sink 30 having the fin 305 can be improved, and the manufacturing cost is reduced.

FIGS. 8A to 8D are diagrams showing forging steps of the heat sink 30 to be used for the semiconductor power module 20 in the embodiment of the invention. In this embodiment, the heat sink 30 having the fin 305 is manufactured by the forging work.

Figure 8A:
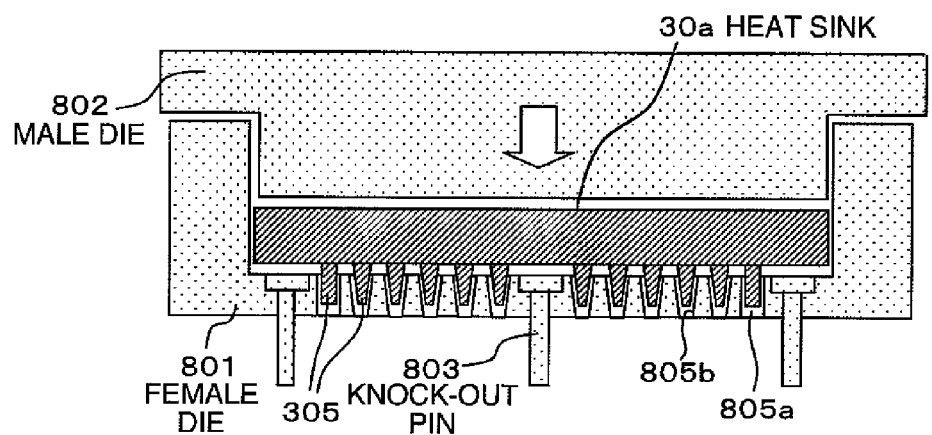
FIGS. 8A to 8D are diagrams respectively showing forging steps for the heat sink for use in the semiconductor power module.

First, as shown in FIG. 8A, a copper material 30a, as a base material for the heat sink 30, is put in a female die 801 (press receiving side) formed of hole portions 805a, 805b each having a shape for the fin 305, and a male die 802 (press giving side) comes down and presses onto the female die 801. The copper material 30a is then pressed into the hole portions 805a, 805b of the female die 801, and the base 304 and fins 305 of the heat sink 30 are molded. At this time, the hole portion 805a on the peripheral portion of the female die 801 has a shape such that the diameter of the upper portion (entrance portion) and lower portion (bottom portion) is the same, or has a substantially cylindrical shape. In contrast, the hole portion 805b on the central portion of the female die 801 is formed by such that the diameter of the upper portion (entrance portion) of hole portion 805b is gradually decreased toward the lower portion (bottom portion). That is, the inner wall of hole portion 805b has a fine inclination angle against a perpendicular surface, or a taper angle.

In fact, the inner wall of hole portion 805b has the taper angle, that is, the diameter of the hole portion 805b is gradually made small toward the bottom portion against a perpendicular inner wall. Therefore, the inner wall of hole portion 805b acts as a resistance against the copper material pressed into the hole portion 805b. Consequently, the length of copper material pressed into the hole portion 805b having the taper angle is shorter than that of the copper material pressed into the hole portion 805a having the inner wall without having the taper angle (or perpendicular wall), when the female die 801 receives the certain pressing force from the top.

Therefore, the hole portion 805a having the perpendicular inner wall is formed on the peripheral portion of the female die 801, and the hole portion 805b having the inner hole of the taper angle is formed on the central portion of the female die 801, so that the length of the fins 305 on the heat sink 30 can be made substantially even.

In addition, all of the taper angles in the hole portions 805b are not necessarily the same. For example, the taper angle is adjusted to an appropriate value in response to the positions of hole portion 805b on the basis of the experiment or experiment manufacture, so that the length of the fins 305 on the heat sink 30 can be made even.

Figure 8B:
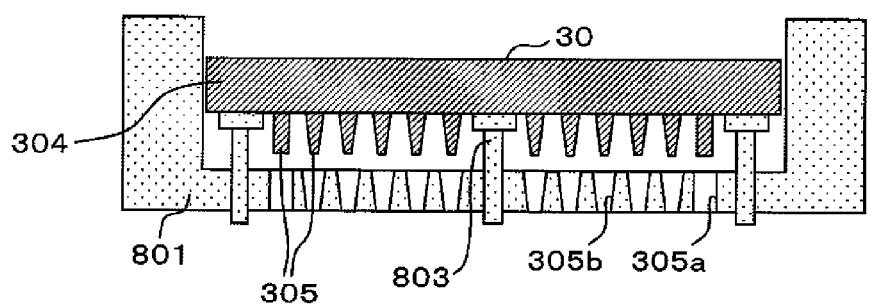
Figure 8C:
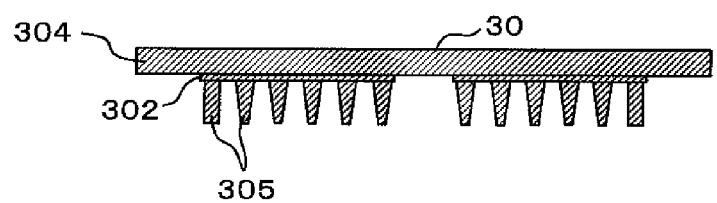

Next, the heat sink 30 molded by the forging work as described above is extruded by a knock-out pin 803 to extract from the female die 801, as shown in FIG. 8B. The milling work is then applied to the extracted heat sink 30 to make the entire surface of base 304 smoothly flattened, so that the heat sink 30, the area of which does not form the fin 305 on the lower surface of base 304 is smoothly flattened, can be obtained, as shown in FIG. 8C. In addition, the pedestal 302 is formed and the bolt holes 307 (referring to FIG. 6) are also formed by the cutting work as required, when applying the milling work.

Figure 8D:
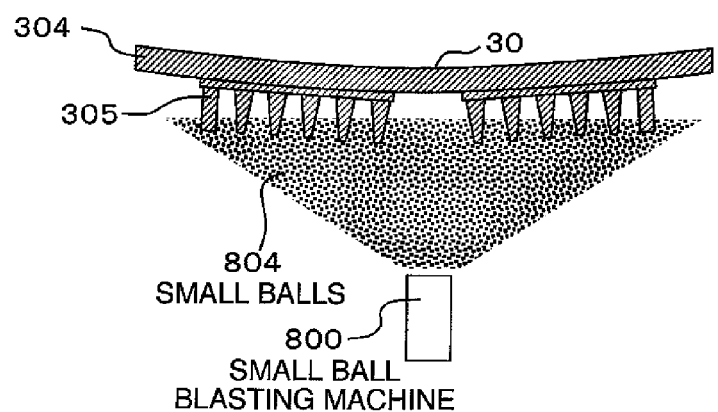

Next, the small balls 804 having as large as 40 μm to 1.3 mm in diameter and Vickers hardness Hv300 are blasted to the lower surface (on which the fin 305 is formed) of base 304 on the heat sink 30 from a small ball blasting machine 800, as shown in FIG. 8D. Here, the Vickers hardness of the forged copper material is not much beyond Hv300 (in fact, the small ball is harder than the copper), therefore, the surface portion of the lower surface of base 304 is contracted. Consequently, the surface portion becomes a condition of such that it is extended laterally. In consequence, the surface portion becomes the convex shape, in fact, the upper surface of base 304 results in a concave shaped bending. As a result of that, the heat sink 30 of which the upper surface of base 304 is bent to the concave shape is obtained.

As described above, the shot blasting work is applied to the lower surface of base 304, so that the lower surface thereof becomes more coarse than that of the surface of the upper surface on which the insulated substrate 4 is bonded, as shown in FIG. 4. In this case, its surface roughness exceeds Ra1.0, but can be restrained to equal to or less than Ra3.2 which is tolerated for sealing the coolant water flow path 19 by the o-ring 15 (referring to FIG. 5).

As described the embodiment above, the semiconductor power module 20 without having the bending for the base 304 on the heat sink can be obtained. Further, the forging work method appropriate to the commercial production can be made the length of fins 305 on the heat sink 30 even. In consequence, it is possible to obtain the power inverter 200 having excellent cooling efficiency.

The above-mentioned power inverter 200 is not only preferable for a vehicle drive power inverter of automobiles, trucks, etc. but also applicable to a power inverter for electric trains, ships, airplanes, etc., an industrial power inverter for use in a control device of electric motors for driving plant facilities, and power inverters for domestic use in a domestic photovoltaic generation system and a control device for the electric motors for driving home electric appliances.

First Variant Example of the Embodiment

Figure 9:
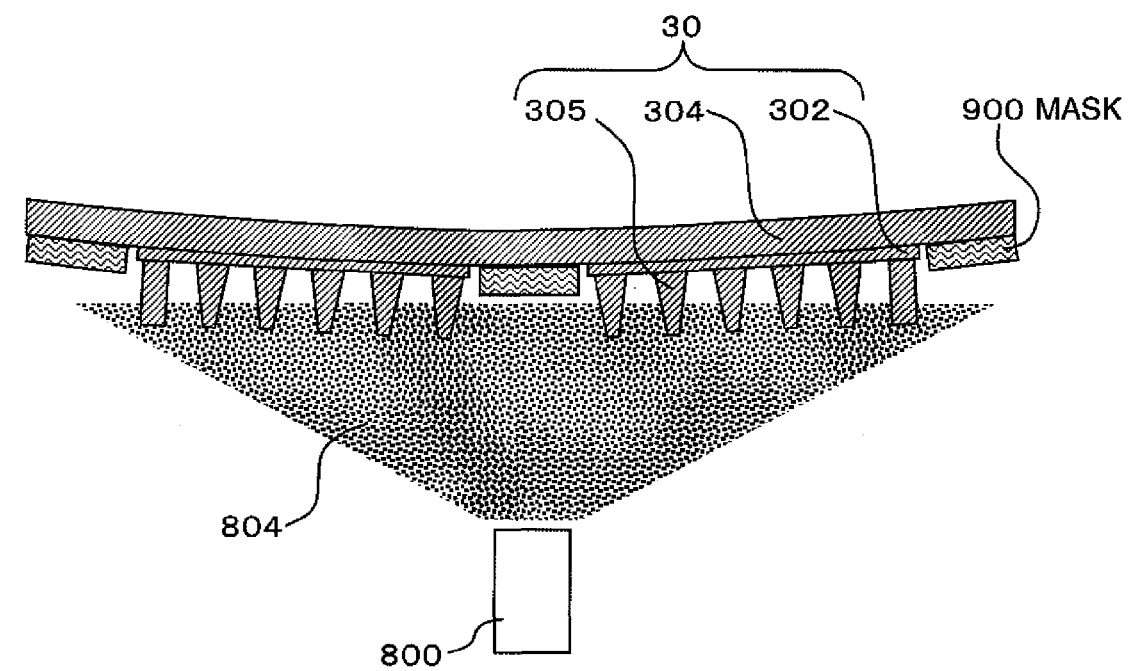
FIG. 9 is a diagram showing a first variant example of the forging step for the heat sink for use in the semiconductor power module.

FIG. 9 is a diagram showing a first variant example of the forging work for the heat sink for use in the semiconductor power module in the embodiment of the invention. In the first variant example of the embodiment, of forging steps, the step of the shot blasting work is only changed. That is, as shown in FIG. 9, a mask 900 is formed on a portion except for the pedestal 302 of the lower surface of base 304 on the heat sink 30, and the shot blasting work is thereafter applied thereto. After terminating the shot blasting work, the mask 900 is removed.

In the case of this shot blasting work, the small balls 804 are not directly blasted to the portion on which the mask 900 is formed, therefore, the roughness of the surface does not become worse. In consequence, the adhesion and sealing performance between the housing wall 12a and base 304 are improved when the opening portion of the upper portion of the coolant water flow path 19 formed on the housing wall 12a (referring to FIG. 4) in the power inverter 200 is closed by the base 304. It is also preferable to seal the coolant water flow path 19 by the o-ring 15.

Second Variant Example of the Embodiment

FIGS. 10A to 10E are diagrams showing a second variant example of the forging work for the heat sink for use in the semiconductor power module in the embodiment of the invention. As shown in FIG. 10, the male die (press giving side) 802a is smaller than the female die 801a, and the press work is therefore performed twice in this variant example of the embodiment. The above-mentioned forging work is preferable for a forging press machine operated by a relatively small pressing force.

In this variant example of the embodiment, the hole portions 805 (805a, 805b) to be used respectively for the fins 305a, 305b are formed on the male die 802a. In this case, it is considered that the press force is easily converged on the central portion of male die 802a. For this reason, the hole portions 805a having the inner wall without having the taper angle (or perpendicular wall) are formed on the peripheral portion of male die 802a, and the hole portions 805b having the inner wall forming the taper angle are formed on the central portion of the male die 802a.

Figure 10A:
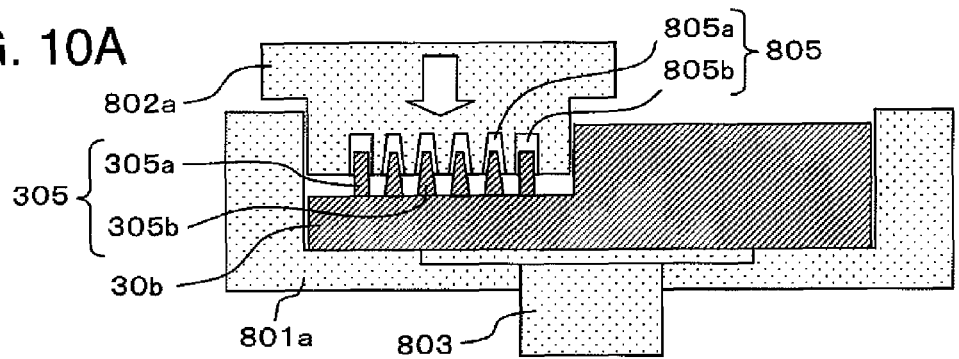
FIGS. 10A to 10E are diagrams showing a second variant example of the forging steps for the heat sink for use in the semiconductor power module.

As shown in FIG. 10A, the copper material 30b, as a base material for the heat sink 30, is put in the female die 801a to then perform a first pressing by the male die 802a. By this pressing, the fins 305a, 305b of a first group (the left side in FIG. 10A) on the heat sink 30 are molded. In this case, the straight fins 305a are molded on the peripheral portion of the first group, and the taper fins 305b are molded on the central portion of the first group. The length of these straight fins 305a and taper fins 305b are therefore made substantially even.

Figure 10B:
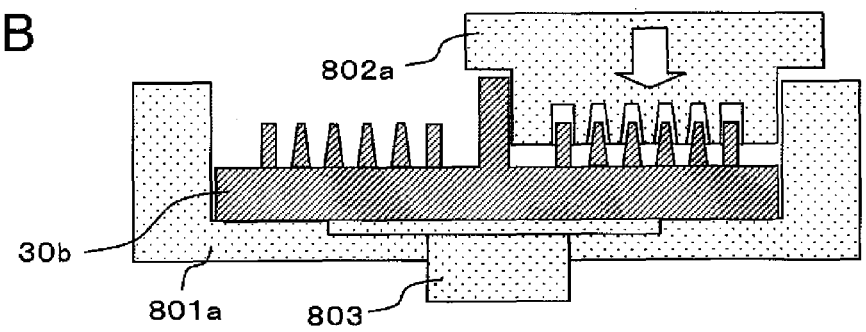

Next, a second pressing is performed by the same male die 802a to mold the fin 305 of a second group (the right side in FIG. 10B). In also this case, the straight fins 305a are molded on the peripheral portion of the second group, and the taper fins 305b are molded on the central portion of the second group.

Figure 10C:
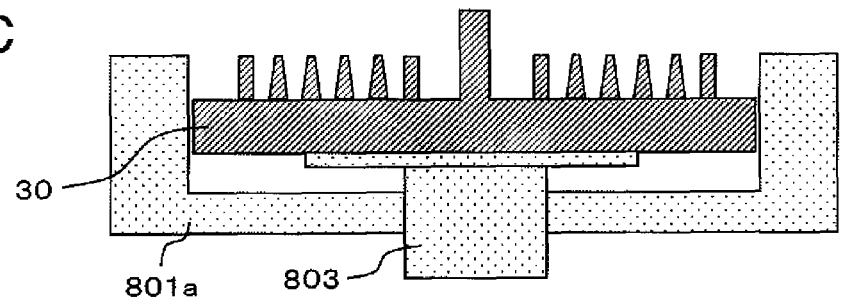
Figure 10D:
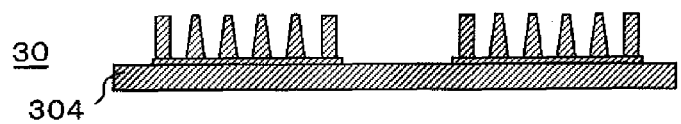
Figure 10E:
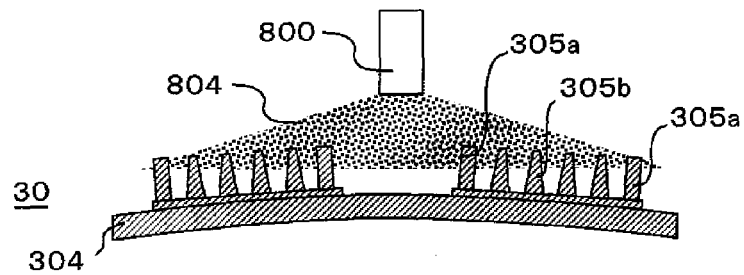

Hereinafter, similarly to the above-mentioned embodiment, the heat sink 30 forged by the steps as described above is extracted from the female die 801a by the knock-out pin 803, as shown in FIG. 10C. The milling work is then applied appropriately to the extracted heat sink 30 (referring to FIG. 10D). The shot blasting work is further applied to the heat sink 30 which was subjected to the milling work, as shown in FIG. 10E.

As described above, the heat sink 30 can be obtained similarly to the above-mentioned embodiment in FIGS. 8A to 8D. However, this variant example is different from the above-mentioned embodiment in that the straight fins 305a are also formed on the central portion of base 304.

Third Variant Example of the Embodiment

FIGS. 11A to 11D are diagrams showing a third variant example of the forging steps for the heat sink for use in the semiconductor power module in the embodiment of the invention. An aspect of the forging steps is that the pedestal 302 is not molded.

Figure 11A:
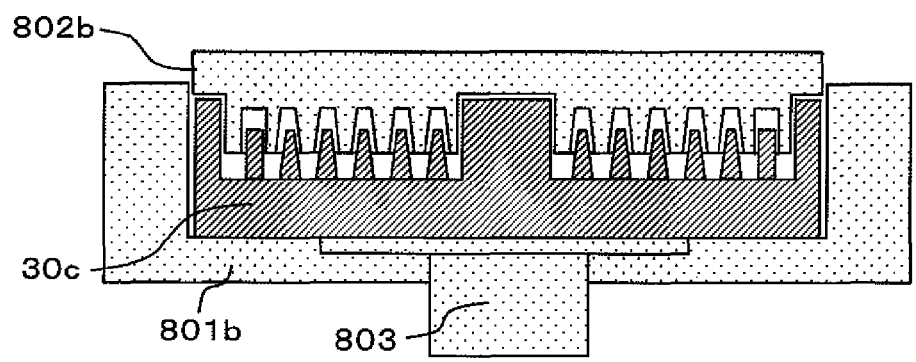
FIGS. 11A to 11D are diagrams showing a third variant example of the forging steps for the heat sink for use in the semiconductor power module.
Figure 11B:
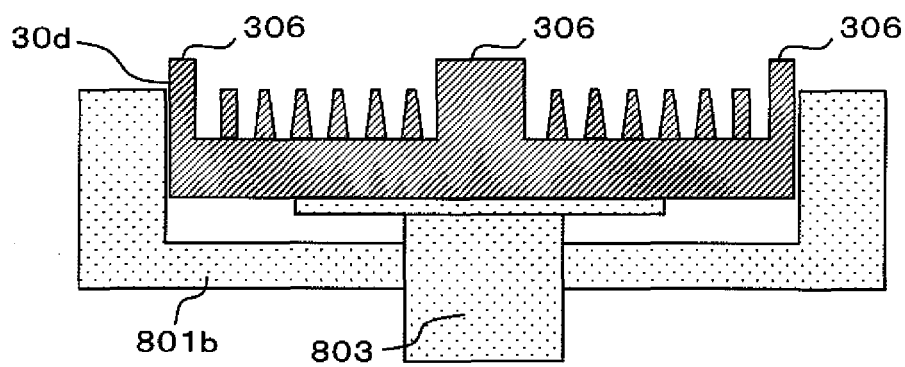

First, similarly to the forging steps in FIGS. 8A to 8D, the copper material is filled as a base material into the female die 801 and pressed by the male die 802 to forge the heat sink 30 as an original mold, as shown in FIG. 11A. Next, the originally molded heat sink 30 is extruded by the knock-out pin 803 to then extract from the female die 801 shown in FIG. 11B. In the shape of originally molded heat sink 30, the base 304 is molded in thick without forming the fins. This is different in that the heat sink 30 is molded by the forging steps as described in FIGS. 8A to 8D.

Figure 11C:
Figure 11D:
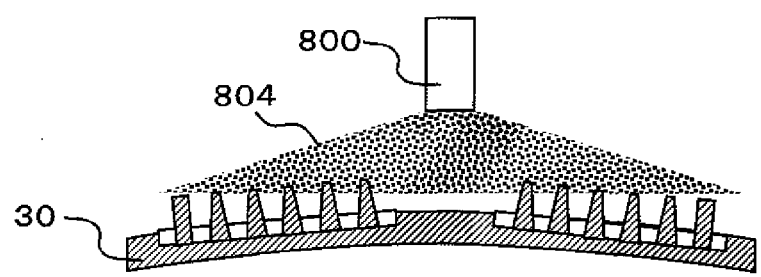

Next, the milling work is applied to the originally molded heat sink 30c, and a predetermined shape heat sink 30 which is determined by this variant example of the embodiment, is formed as shown in FIG. 11C. That is, thick formed base portions 306 of the base 304 are cut by the milling work, or the surface of base 304 on which the fins 305 are not molded is cut to make the base 304 entirely thin. Thereafter, the shot blasting work is applied to the heat sink 30, similarly to the above-mentioned embodiment, to add a bending to the base 304, as shown in FIG. 11D.

Figure 12:
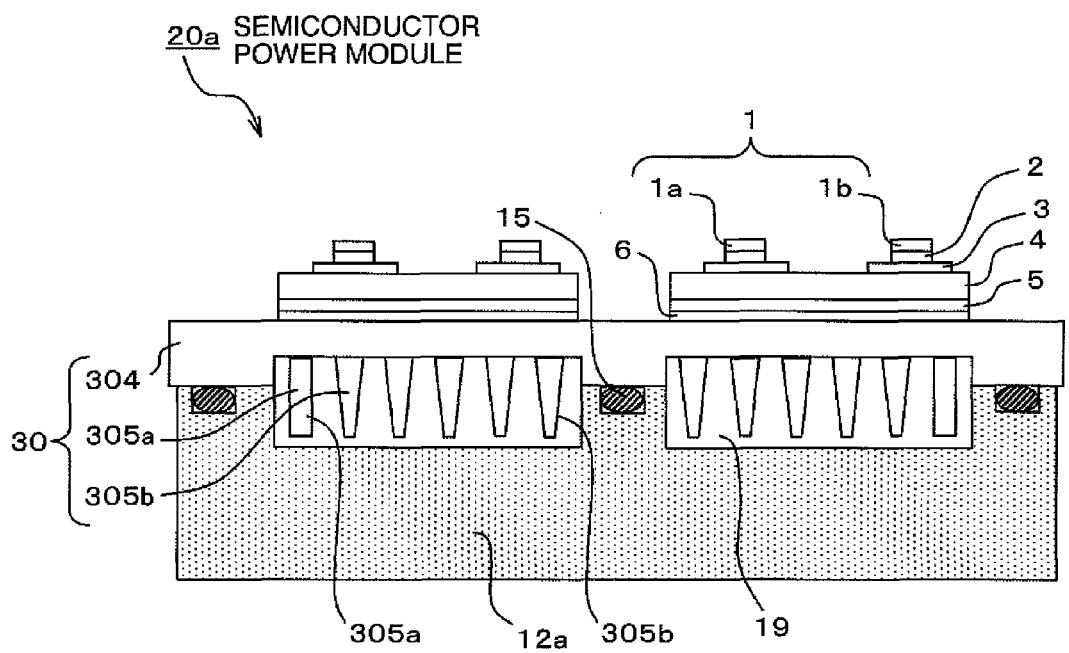
FIG. 12 is a schematic diagram showing an aspect that the semiconductor power module used with the heat sink manufactured by the forging steps of the third variant example is mounted on the housing in the power inverter.

FIG. 12 is a schematic diagram showing an aspect that the semiconductor power module 20 using the heat sink 30 manufactured by the forging steps of the above-mentioned third variant example in the embodiment of the invention is mounted on the housing 12 in the power inverter 200. This structure is almost the same as shown in the schematic diagram of FIG. 4, but the thickness of base 304 of the area on which the fin 305 is molded is different.

That is, the pedestal 302 has not been formed in this variant example of the embodiment, therefore, the thickness of the base 304 of the area on which the fin 305 is molded is thinner by the thickness of pedestal 302 than that formed by the above-mentioned embodiment in FIG. 4. In consequence, a distance from the heat generating device 1 to the fin 305 in this variant example becomes shorter than that in the other examples, so that the heat transfer resistance can be reduced and the radiation effect of fin 305 can be improved by the distance.

Fourth Variant Example of the Embodiment

Figure 13:
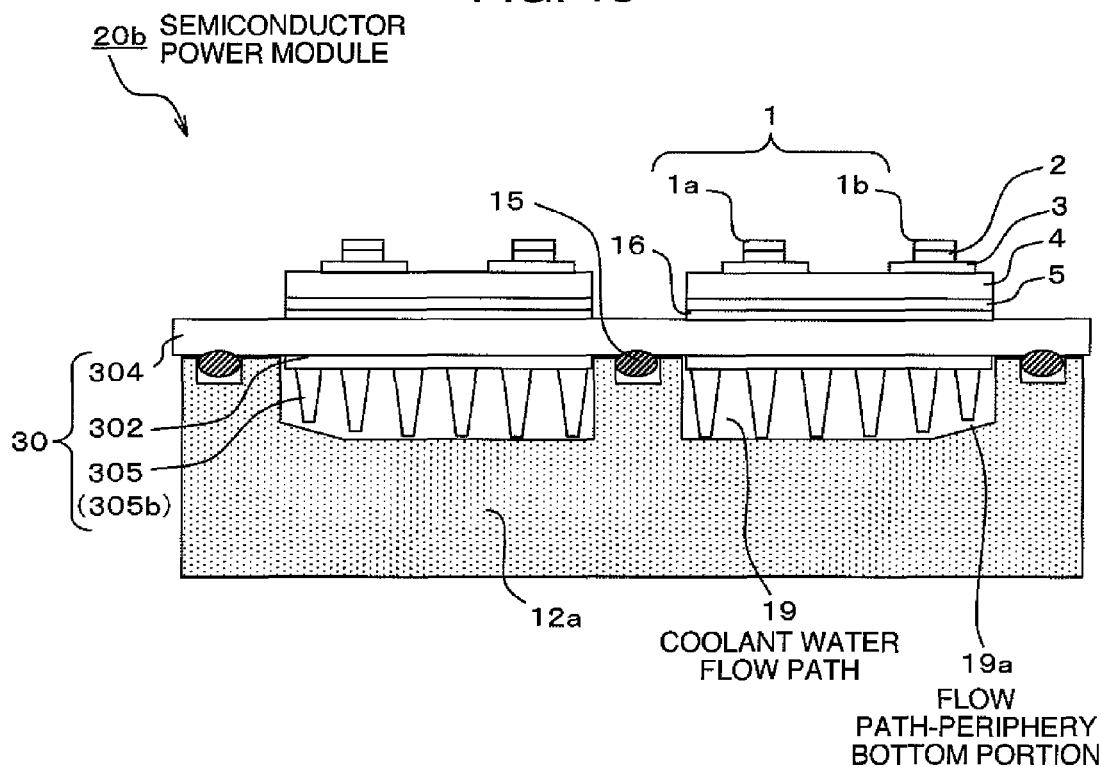
FIG. 13 is a schematic diagram showing an aspect that the semiconductor power module related to a fourth variant example is mounted on the housing in the power inverter.

FIG. 13 is a schematic diagram showing an aspect that the semiconductor power module 20 in a fourth variant example of the embodiment in the invention is mounted on the housing 12 in the power inverter 200. The heat sink 30 in this variant example of the embodiment has an aspect of having the fins 305, all of which are the taper fins 305b. Alternatively, the fins 305, all of which are the straight fins 305a, may be used.

In this case, the length of the fin 305 on the peripheral portion of base 304 is molded shorter than that of the fin 305 on the central portion of base 304. When the depth of coolant water flow path 19 is the same at the central portion as well as the peripheral portion, the flow resistance becomes small at the coolant water flow path 19 of the peripheral portion. In consequence, a flow velocity and flow rate of the coolant water become large at the peripheral portion of coolant water flow path 19. As a result, the cooling capacity of the fin 305 is improved at the peripheral portion, but reduced at the central portion. Therefore, the cooling capacity is reduced entirely.

Consequently, a taper portion (flow path-periphery bottom portion 19a) is formed on a periphery bottom portion of the coolant water flow path 19, and the coolant water flow path 19 is gradually shallow toward the periphery of housing wall 12a in the coolant water follow path 19. As a result, the flow velocity and flow rate of the coolant water is made uniform in the coolant water flow path 19, and the cooling capacity of the fin 305 can be made uniform. Therefore, the reduction of cooling capacity can be prevented from causing non-uniform flow velocity and flow rate of the coolant water.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor power module comprising:
an insulated substrate a plurality of power semiconductor devices mounted thereon; and
a heat sink integrally molded with a plurality of radiation fins on one surface of a planate base for radiating a heat generated from the plurality of power semiconductor devices, wherein
the insulated substrate is bonded by metallic bonding to another surface of the base of the heat sink opposite the one surface of the base of the heat sink on which the radiation fins are formed,
a shot blasting work is applied to the one surface of the base on which the radiation fins are formed, so that the one surface of the base on which the radiation fins are formed has a surface roughness more coarse than that of the another surface of the base of the heat sink on which the insulated substrate is bonded.

2. The semiconductor power module according to claim 1 wherein the radiation fins formed on the base of the heat sink include circular pin fins in a shape of cross section,
pin fins having a diameter at an end portion substantially equal to that at a base portion being molded on a peripheral portion of the base, and
pin fins having a diameter at the end portion gradually made smaller than that at the base portion being molded on a central portion of the base.

3. The semiconductor power module according to claim 1, wherein
said shot blasting work is blasting small balls harder than the metallic material on the surface of the base on which the radiation fins are formed, prior to metallically bonding the insulated substrate mounting with the plurality of power semiconductor devices on the base of the heat sink.

4. The semiconductor power module according to claim 1, wherein
the plurality of radiation fins are formed on the one surface of the planate base by a forging work such that a metallic material filled into a female die of a predetermined shape is pressed by a male die of a predetermined shape.

5. A power inverter including a semiconductor power module wherein
the semiconductor power module comprises:
an insulated substrate with a plurality of power semiconductor devices mounted thereon; and
a heat sink integrally molded with a plurality of radiation fins on one surface of a planate base for radiating a heat generated from the plurality of power semiconductor devices,
the insulated substrate is bonded by metallic bonding to another surface of the base of the heat sink opposite the one surface of the base of the heat sink on which the radiation fins are formed,
a shot blasting work is applied to the surface of the one surface of the base on which the radiation fins are formed, so that the one surface of the base on which the radiation fins are formed has a surface roughness more coarse than that of the another surface of the base of the heat sink on which the insulated substrate is bonded, and
the power inverter includes a coolant water flow path formed on a housing wall of the power inverter, and the heat sink of the semiconductor power module is mounted on the housing wall such that the radiation fins are immersed in the coolant water flow path.

6. The power inverter according to claim 5 wherein a depth of the coolant water flow path is deep at correspondence to a central portion of the semiconductor power module mounted on the housing wall on which the coolant water flow path is formed, and shallow at correspondence to a peripheral portion of the semiconductor power module.

7. A semiconductor power module comprising:
an insulated substrate with a plurality of power semiconductor devices mounted thereon; and
a heat sink integrally molded with a plurality of radiation fins on one surface of a planate base for radiating a heat generated from the plurality of power semiconductor devices, wherein
the insulated substrate is bonded by metallic bonding to another surface of the base of the heat sink opposite the one surface of the base of the heat sink on which the radiation fins are formed,
the radiation fins formed on the base of the heat sink include circular pin fins in a shape of cross section, pin fins having a diameter at an end portion equal to that at a base portion being molded on a peripheral portion of the base, and pin fins having a diameter at the end portion gradually made smaller than that at the base portion being molded on a central portion of the base.

* * * * *